United States Patent
Hong

(10) Patent No.: US 10,164,619 B2
(45) Date of Patent: Dec. 25, 2018

(54) ELECTRONIC DEVICE AND METHOD OF CONTROLLING CLOCK FREQUENCY OF ELECTRONIC DEVICE

(71) Applicant: Samsung Electronics Co., Ltd., Gyeonggi-do (KR)

(72) Inventor: Eun-Seok Hong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 393 days.

(21) Appl. No.: 14/882,098

(22) Filed: Oct. 13, 2015

(65) Prior Publication Data
US 2016/0105167 A1   Apr. 14, 2016

(30) Foreign Application Priority Data

Oct. 13, 2014   (KR) .................. 10-2014-0137945

(51) Int. Cl.
*H03K 5/00*     (2006.01)
*H03K 5/1252*   (2006.01)

(52) U.S. Cl.
CPC ....... *H03K 5/1252* (2013.01); *H03K 5/00006* (2013.01)

(58) Field of Classification Search
CPC ............. H03K 5/1252; H03K 5/00006; H04B 1/0475; H04B 1/10; H04B 15/02; H04B 15/04
See application file for complete search history.

(56) References Cited

U.S. PATENT DOCUMENTS

| | | | |
|---|---|---|---|
| 8,604,852 B1 | 12/2013 | Turullols et al. | |
| 2002/0142724 A1* | 10/2002 | Nakano | H04B 15/04 455/62 |
| 2011/0051700 A1* | 3/2011 | Geiger | H04J 3/0688 370/338 |
| 2011/0068836 A1 | 3/2011 | Wang et al. | |
| 2011/0274221 A1* | 11/2011 | Yang | H04B 1/0475 375/344 |
| 2012/0042193 A1* | 2/2012 | Gupta | G06F 1/08 713/501 |
| 2014/0177609 A1* | 6/2014 | Vandenameele | H04B 15/06 370/336 |

* cited by examiner

*Primary Examiner* — Nguyen T Vo
(74) *Attorney, Agent, or Firm* — The Farrell Law Firm, P.C.

(57) ABSTRACT

A method of controlling a clock frequency of an electronic device and an electronic device using the same is provided. The electronic device includes a check module that is configured to check a clock frequency of at least one Radio Frequency (RF) band, and a control module that is configured to shift a clock frequency of a high speed signal such that a noise generation clock frequency and the clock frequency of the at least one RF band checked by the check module are not identical, when an interface of the high speed signal is used.

8 Claims, 9 Drawing Sheets

<CLOCK FREQUENCY: 500MHz (DATA RATE= 1Gbps)>

| RF BAND | CHANNEL | |
|---|---|---|
| GSM850 | 157 (157~157) | |
| EGSM | 117 (117~117) | |
| DCS | 653 (653~653) | 861 (861~861) |
| PCS | 653 (653~653) | |
| Band 1 | 10625 (10625~10625) | 10833 (10833~10833) |
| Band 2 | 9792 (9792~9792) | |
| Band 3 | | |
| Band 4 | | |
| Band 5 | 4375 (4375~4375) | |
| Band 6 | | |
| Band 7 | | |
| Band 8 | | |
| GPS | | |
| Glonass | | |
| - | | |
| 2.4G | | |
| 5G | | |
| - | | |
| | | |
| | | |
| | | |
| Band 1 | | |
| Band 2 | | |
| Band 3 | | |
| Band 4 | 2100 | |
| Band 5 | | |
| Band 6 | | |
| Band 7 | | |
| Band 8 | | |
| Band 9 | | |
| Band 10 | | |
| Band 11 | | |
| Band 12 | | |
| Band 13 | 5220 | |
| Band 14 | | |

FIG.5A

<CLOCK FREQUENCY: 499.5MHz (DATA RATE= 999Mbps)>

| RF BAND | CHANNEL | |
|---|---|---|
| GSM850 | 153 (153~153) | |
| EGSM | 112 (112~112) | |
| DCS | 643 (643~643) | 852 (852~852) |
| PCS | 643 (643~643) | |
| Band 1 | 10614 (10614~10614) | 10823 (10823~10823) |
| Band 2 | 9782 (9782~9782) | |
| Band 3 | | |
| Band 4 | | |
| Band 5 | 4371 (4371~4371) | |
| Band 6 | | |
| Band 7 | | |
| Band 8 | 3087 (3087~3087) | |
| GPS | | |
| Glonass | | |
| - | | |
| 2.4G | | |
| 5G | | |
| - | | |
| | | |
| | | |
| | | |
| Band 1 | | |
| Band 2 | | |
| Band 3 | | |
| Band 4 | 2079 | |
| Band 5 | | |
| Band 6 | | |
| Band 7 | | |
| Band 8 | | |
| Band 9 | | |
| Band 10 | | |
| Band 11 | | |
| Band 12 | | |
| Band 13 | 5212 | |
| Band 14 | | |

FIG.5B

ELECTRONIC DEVICE AND METHOD OF CONTROLLING CLOCK FREQUENCY OF ELECTRONIC DEVICE

PRIORITY

This application claims priority under 35 U.S.C. § 119(a) to Korean Application Serial No. 10-2014-0137945, which was filed in the Korean Intellectual Property Office on Oct. 13, 2014, the entire content of which is incorporated herein by reference.

BACKGROUND

1. Field of Invention

The present invention relates generally to an electronic device and a method of controlling a clock frequency.

2. Description of the Related Art

A clock of an electronic device performs functions of synchronizing all operations of various elements operated in a system, controlling an time for a specific operation, maintaining an accurate time to be provided to a program, etc. The clock may include a system clock, a time division clock, a communication clock, a real time clock, and the like. A pulse generation period of the system clock is referred to as a clock period or a clock frequency, and is usually represented in megahertz (MHz). For example, a clock frequency of 1 MHz indicates a clock speed of 1,000,000 periods per second.

According to the characteristics and the purpose of a signal, a clock frequency of the signal may be fixed and used, and when the clock frequency of the signal is fixed and used, a clock frequency in which noise is generated in a regular interval may be generated. In addition, when a clock frequency of a high speed signal, using a specific interface (e.g., an MIPI interface) is fixed, a clock frequency in which noise is generated may be generated.

Accordingly, when an interface of a high speed signal of which a clock frequency is fixed and used, and when a clock frequency of an RF band which is being used is identical to a clock frequency in which noise is generated, among clock frequencies of the high speed signal, RF performance may be degraded.

SUMMARY

The present invention has been made to address at least the problems and disadvantages described above, and to provide at least the advantages described below.

Accordingly, an aspect of the present invention is to control a clock frequency of an interface of a high speed signal to prevent a degradation of RF performance while an interface of a high speed signal is used.

In accordance with an aspect of the present invention, an electronic device is provided. The device includes a check module that is configured to check a clock frequency of at least one Radio Frequency (RF) band, and a control module that is configured to shift a clock frequency of a high speed signal such that a noise generation clock frequency and the clock frequency of the at least one RF band checked by the check module are not identical, when an interface of the high speed signal is used.

In accordance with another aspect of the present invention, a method of controlling a clock frequency of an electronic device is provided. The method includes checking a clock frequency of at least one Radio Frequency (RF) band, and shifting a clock frequency of a high speed signal such that a noise generation clock frequency and the clock frequency of the at least one RF band checked are not identical, when an interface of the high speed signal is used.

An electronic device and a method of controlling a clock frequency of an electronic device according to various embodiments may prevent an RF performance degradation while an interface of a high speed signal is used.

BRIEF DESCRIPTION OF THE DRAWINGS

The above and other aspects, features, and advantages of the present invention will be more apparent from the following detailed description taken in conjunction with the accompanying drawings, in which:

FIGS. 5A and 5B illustrate types of RF bands having a clock frequency identical to a noise generation clock frequency of a high speed signal in an electronic device, according to an embodiment of the present invention;

DETAILED DESCRIPTION OF EMBODIMENTS OF THE PRESENT INVENTION

Figure 1:
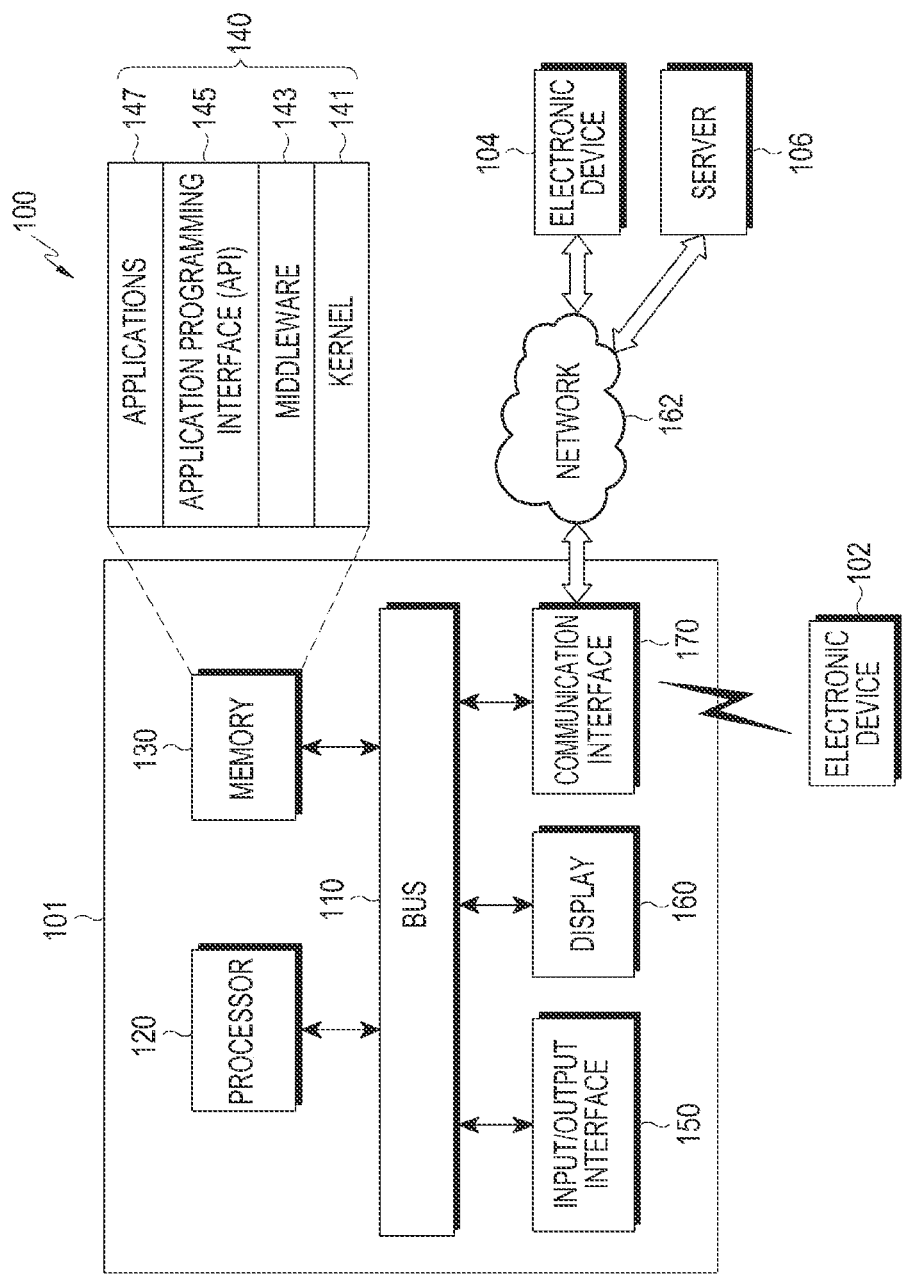
FIG. 1 illustrates a network environment including an electronic device, according to an embodiment of the present invention.

Hereinafter, various embodiments of the present invention will be described with reference to the accompanying drawings. However, it should be understood that there is no intent to limit the present invention to the particular forms disclosed herein; rather, the present invention should be construed to cover various modifications, equivalents, and/or alternatives of embodiments of the present invention. In describing the drawings, similar reference numerals may be used to designate similar constituent elements.

In the present disclosure, the expressions "have", "may have", "include", and "may include" refer to the existence of a corresponding feature (e.g., numerical value, function, operation, or components of such as elements), and do not exclude the existence of additional features.

In the present disclosure, the expressions "A or B", "at least one of A or/and B", and "one or more of A or/and B" may include all possible combinations of the items listed. For example, the expressions "A or B", "at least one of A and B", or "at least one of A or B" may include A, may include B, or may include both A and B.

The expressions "first" and "second", used in the present disclosure, may modify various components regardless of the order and/or the importance, but does not limit the corresponding components. The above expressions are used merely for the purpose of distinguishing an element from the other elements. For example, a first user device and a second user device indicate different user devices although both of them are user devices. For example, a first element may be referred to as a second element, and similarly, a second element may be referred to as a first element without departing from the scope of the present invention.

When it is mentioned that one element (e.g., a first element) is "operatively or communicatively "coupled" or "connected" with/to" another element (e.g., a second element), it should be construed that either the one element is directly connected to the another element or the one element is indirectly connected to the another element via yet another element (e.g., a third element). In contrast, when an element (e.g., a first element) is referred to as being "directly connected," or "directly coupled" to another element (e.g., a second element), there are no element interposed between the two elements.

The expression "configured to", used in the present disclosure, may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g. an embedded processor) only for performing the corresponding operations or a generic-purpose processor (e.g., a central processing unit (CPU) or application processor (AP)) that can perform the corresponding operations by executing one or more software programs stored in a memory device.

The terms used herein are merely for the purpose of describing particular embodiments and are not intended to limit the scope of other embodiments. As used herein, singular forms may include plural forms as well, unless the context clearly indicates otherwise. Unless defined otherwise, all terms used herein, including technical and scientific terms, have the same meaning as those commonly understood by a person skilled in the art to which the present invention pertains. Such terms as those defined in a generally used dictionary are to be interpreted to have meanings equivalent to the contextual meanings in the relevant field of the art, and are not to be interpreted to have ideal or excessively formal meanings, unless clearly defined in the present invention. In some cases, even a term defined in the present disclosure should not be interpreted to exclude certain embodiments of the present invention.

The electronic device of the present invention may include at least one of a smartphone, a tablet Personal Computer (PC), a mobile phone, a video phone, an electronic book (e-book) reader, a desktop PC, a laptop PC, a netbook computer, a Personal Digital Assistant (PDA), a Portable Multimedia Player (PMP), an MP3 player, a mobile medical appliance, a camera, and a wearable device (e.g., a Head-Mounted Device (HMD), such as electronic glasses, electronic clothes, an electronic bracelet, an electronic necklace, an electronic appcessory, electronic tattoos, or a smart watch).

According to some embodiments, the electronic device may be a smart home appliance. The home appliance may include at least one of, for example, a television, a Digital Versatile Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment device, an electronic device for a ship (e.g., a navigation device and a gyro-compass), avionics, security devices, an automotive head unit, a robot for home or industry, an Automatic Teller Machine (ATM), Point of Sales (POS) machine, or Internet of Things device (e.g., a light bulb, various sensors, electric or gas meter, a sprinkler device, a fire alarm, a thermostat, a streetlamp, a toaster, sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter).

The electronic device according to various embodiments of the present invention may be a combination of one or more of the aforementioned various devices.

The electronic device according to some embodiments of the present invention may be a flexible device.

Further, the electronic device according to an embodiment of the present invention is not limited to the aforementioned devices, and may include a new electronic device according to the development of technology.

Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates a network environment including an electronic device, according to an embodiment of the present invention.

Referring to FIG. 1, an electronic device 101, within a network environment 100, is described. The electronic device 101 includes a bus 110, a processor 120, a memory 130, an input/output interface 150, a display 160, and a communication interface 170. In any embodiment, the electronic device 101 may omit at least one of the above components or further include other components.

The bus 110 may include, for example, a circuit for connecting the processor 120, the memory 130, the input/output interface 150, the display 160, and the communication interface 170 to each other and transferring communication (for example, a control message and/or data) between the elements.

The processor 120 may include one or more of a Central Processing Unit (CPU), an Application Processor (AP), and a Communication Processor (CP).

The processor 120 controls one or more other components of the electronic device 101 and/or processes an operation or data related to communication.

The memory 130 includes a volatile memory and/or a non-volatile memory. The memory 130 stores commands or data related to at least one other component of the electronic device 101. The memory 130 may store software and/or a program 140.

The program 140 may include a kernel 141, middleware 143, an Application Programming Interface (API) 145, and/or application programs (or applications) 147. At least some of the kernel 141, the middleware 143, and the API 145 may be referred to as an Operating System (OS).

The kernel 141 controls or manages system resources (for example, the bus 110, the processor 120, or the memory 130) used for executing an operation or function implemented by the other elements of the program 140 (for example, the middleware 143, the API 145, or the applications 147). Furthermore, the kernel 141 may provide an interface through which the middleware 143, the API 145, or applications 147 may access individual components of the electronic device 101 to control or manage system resources.

The middleware 143 serves as an intermediary such that the API 145 or the applications 147 communicate with the kernel 141 to transmit/receive data. Furthermore, in regard to task requests received from the applications 147, the middleware 143 performs a control (for example, scheduling or load balancing) for the task requests using a method of assigning a priority for using the system resources (for example, the bus 110, the processor 120, or the memory 130) of the electronic device 101 to at least one of the applications 147.

The API 145 is an interface by which the applications 147 control functions provided from the kernel 141 or the middleware 143, and may include, for example, at least one interface or function (for example, instructions) for file control, window control, image processing, or text control.

The input/output interface 150 serves as an interface which can transmit commands or data input from the user or another external device to other component(s) of the electronic device 101. Further, the input/output interface 150 may output commands or data received from another component(s) of the electronic device 101 to the user or another external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160 displays various types of contents (for example, text, images, videos, icons, or symbols) for users. The display 160 may include a touch screen, and may receive, for example, a touch, gesture, proximity, or hovering input using an electronic device or a user's body part.

The communication interface 170 connects communication between, for example, the electronic device 101 and an external device (for example, a first external electronic device 102, a second external electronic device 104, or a server 106). For example, the communication interface 170 may be connected to a network 162 through wireless or wired communication to communicate with the external electronic device 104 or the server 106.

The wireless communication may use, for example, at least one of Long Term Evolution (LTE), Long Term Evolution-Advanced (LTE-A), Code Division Multiple Access (CDMA), Wideband CDMA (WCDMA), Universal Mobile Telecommunication System (UMTS), Wireless Broadband (WiBro), and Global System for Mobile communication (GSM) as a cellular communication protocol.

The wired communication may include at least one of, for example, a Universal Serial Bus (USB), a High Definition Multimedia Interface (HDMI), Recommended Standard 232 (RS-232), and a Plain Old Telephone Service (POTS). The network 162 may include at least one communication network such as a computer network (for example, a LAN or a WAN), the Internet, and a telephone network.

Each of the first and second external electronic devices 102 and 104 may be a device which is the same as or different from the electronic device 101.

The server 106 may include a group of at least one server. All or some of operations executed in the electronic device 101 may be executed in another or other electronic devices (e.g., the electronic devices 102 and 104 or the server 106). According to an embodiment, when the electronic device 101 should perform some functions or services automatically or by a request, the electronic device 101 may make a request for performing at least some of the functions related to the functions or services to the electronic devices 102 and 104 or the server 106 instead of performing the functions or services by itself. The electronic devices 102 and 104 or the server 106 may execute the requested functions or additional functions, and transmit a result thereof to the electronic device 101. The electronic device 101 may provide the requested functions or services based on the received result or after additionally processing the received result. To this end, for example, cloud computing, distributed computing, or client-server computing technology may be used.

Figure 2:
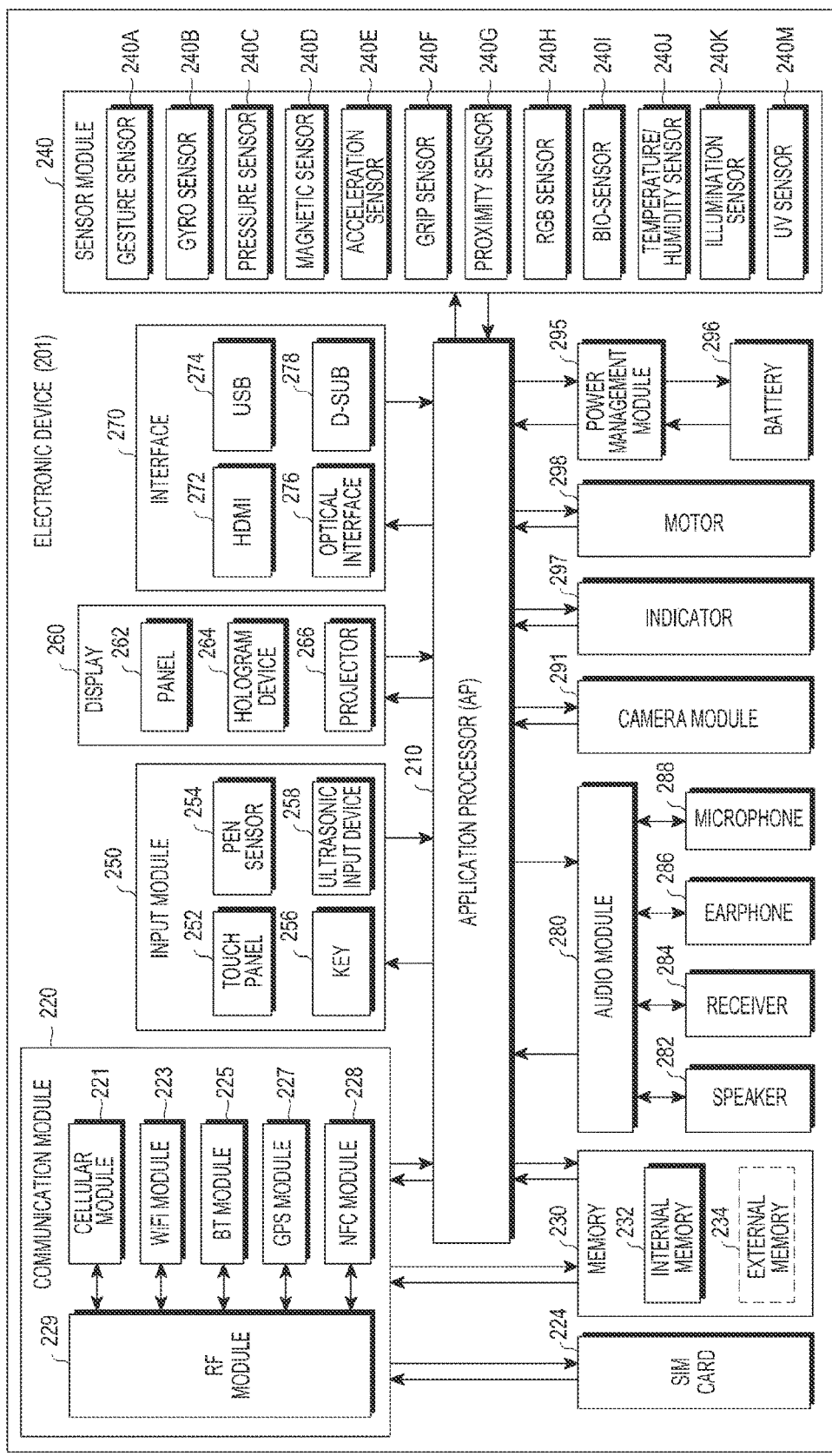
FIG. 2 is a block diagram illustrating an electronic device, according to an embodiment of the present invention.

FIG. 2 is a block diagram illustrating an electronic device, according to an embodiment of the present invention.

Referring to FIG. 2, an electronic device 201, according to various embodiments of the present invention, is provided. The electronic device 201 may include all or some of the components of electronic device 101 illustrated in FIG. 1. The electronic device 201 includes at least one Application Processor (AP) 210, a communication module 220, a Subscriber Identification Module (SIM) card 224, a memory 230, a sensor module 240, an input module 250, a display 260, an interface 270, an audio module 280, a camera module 291, a power management module 295, a battery 296, an indicator 297, and a motor 298.

The AP 210 controls a plurality of hardware or software components connected thereto by driving an operating system or an application program and perform a variety of data processing and calculations. The AP 210 may be implemented by, for example, a System on Chip (SoC). The AP 210 may further include a Graphic Processing Unit (GPU) and/or an image signal processor. The AP 210 may include at least some of the components of the communication module 220 (for example, a cellular module 221). The AP 210 loads instructions or data, received from at least one other element of the electronic device 201 (for example, a non-volatile memory), in a volatile memory to process the loaded instructions or data and stores various types of data in a non-volatile memory.

The communication module 220 may have a component equivalent or similar to the communication interface 160 of FIG. 1. The communication module 220 includes a cellular module 221, a WiFi module 223, a Bluetooth (BT) module 225, a GPS module 227, an Near-Field Communication (NFC) module 228, and a Radio Frequency (RF) module 229.

The cellular module 221 provides a voice call, video call, Short Message Service (SMS), or an Internet service through a communication network. The cellular module 221 may distinguish between and authenticate electronic devices 201 within a communication network using a subscriber identification module (for example, the SIM card 224). The cellular module 221 may perform at least some of the functions which can be provided by the AP 210. According to an embodiment, the cellular module 221 may include a Communication Processor (CP).

The WiFi module 223, the BT module 225, the GPS module 227, and the NFC module 228 may include a processor for processing data transmitted/received through the corresponding module. According to any embodiment, at least some of the cellular module 221, the WiFi module 223, the BT module 225, the GPS module 227, and the NFC module 228 may be included in one Integrated Chip (IC) or IC package.

The RF module 229 transmits/receives a communication signal (for example, an RF signal). The RF module 229 may include, a transceiver, a Power Amp Module (PAM), a frequency filter, a Low Noise Amplifier (LNA) or an antenna. At least one of the cellular module 221, the WiFi module 223, the BT module 225, the GPS module 227, and the NFC module 228 may transmit/receive an RF signal through a separate RF module.

The SIM card 224 is a card which contains unique identification information (for example, an Integrated Circuit Card Identifier (ICCID)) or subscriber information (for example, an International Mobile Subscriber Identity (IMSI)). The SIM card 224 may be inserted into a slot formed in the electronic device 201.

The memory 230 includes an internal memory 232 or an external memory 234.

The internal memory 232 may include at least one of, for example, a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a flash memory (for example, a NAND flash memory or a NOR flash memory), a hard driver, or a Solid State Drive (SSD).

The external memory 234 may include a flash drive, for example, a Compact Flash (CF), a Secure Digital (SD), a Micro Secure Digital (Micro-SD), a Mini Secure Digital (Mini-SD), an extreme Digital (xD), a memory stick, etc. The external memory 234 may be functionally and/or physically connected to the electronic device 201 through various interfaces.

The sensor module 240 measures a physical quantity or detects an operation state of the electronic device 201, and converts the measured or detected information into an electrical signal. The sensor module 240 may include, for example, at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H (for example, Red, Green, and Blue (RGB) sensor), a biometric sensor 240I, a temperature/humidity sensor 240J, an illumination sensor 240K, and an Ultra Violet (UV) sensor 240M. Additionally or alternatively, the sensor module 240 may include an E-nose sensor, an electromyography (EMG) sensor, an electroencephalogram (EEG) sensor, an electrocardiogram (ECG) sensor, an infrared (IR) sensor, an iris scanner, and/or a fingerprint sensor. The sensor module 240 may further include a control circuit for controlling at least one sensor included therein. The electronic device 201 may further include a processor configured to control the sensor module 240 as a part of or separately from the AP 210, and may control the sensor module 240 while the AP 210 is in a sleep state.

The input module 250 may include a touch panel 252, a (digital) pen sensor 254, a key 256, or an ultrasonic input device 258.

The touch panel 252 may use at least one of a capacitive type, a resistive type, an infrared type, and an ultrasonic type. The touch panel 252 may further include a control circuit. The touch panel 252 may further include a tactile layer and provide a tactile reaction to the user.

The (digital) pen sensor 254 may include a recognition sheet which is a part of the touch panel or a separate recognition sheet.

The key 256 may include a physical button, an optical key or a keypad.

The ultrasonic input device 258 detects an acoustic wave using microphone 288 of the electronic device 201, through an input tool generating an ultrasonic signal, to identify data.

The display 260 may include a panel 262, a hologram device 264 or a projector 266.

The panel 262 may include a component equivalent or similar to the display 160 of FIG. 1. The panel 262 may be implemented to be flexible, transparent, or wearable. The panel 262 may also be configured as one module together with the touch panel 252.

The hologram 264 displays a stereoscopic image in the air by using interference of light.

The projector 266 projects light onto a screen to display an image. The screen may be placed, for example, in the interior or on the exterior of the electronic device 201.

The display 260 may further include a control circuit for controlling the panel 262, the hologram device 264, or the projector 266.

The interface 270 may include a High-Definition Multimedia Interface (HDMI) 272, a Universal Serial Bus (USB) 274, an optical interface 276, or a D-subminiature (D-sub) 278. The interface 270 may be included in, for example, the communication interface 160, illustrated in FIG. 1. Additionally or alternatively, the interface 290 may include a Mobile High-definition Link (MHL) interface, a Secure Digital (SD) card/Multi-Media Card (MMC) interface, or an Infrared Data Association (IrDA) standard interface.

The audio module 280 may bilaterally convert a sound and an electrical signal. At least some components of the audio module 280 may be included in, for example, the input/output interface 140 illustrated in FIG. 1. The audio module 280 processes sound information which is input or output through, for example, a speaker 282, a receiver 284, earphones 286, and the microphone 288.

The camera module 291 is a device which captures a still image and a video. The camera module 291 may include one or more image sensors (for example, a front sensor or a back sensor), a lens, an Image Signal Processor (ISP) or a flash (for example, LED or xenon lamp).

The power management module 295 manages power of the electronic device 201. The power management module 295 may include a Power Management Integrated Circuit (PMIC), a charger Integrated Circuit (IC), or a battery gauge. The PMIC may have a wired and/or wireless charging scheme. A magnetic resonance scheme, a magnetic induction scheme, or an electromagnetic scheme may be exemplified as the wireless charging method, and an additional circuit for wireless charging, such as a coil loop circuit, a resonance circuit, a rectifier circuit, etc. may be added. The battery gauge measures, for example, the remaining amount of battery, a charging voltage, current, or temperature. The battery 296 may include, for example, a rechargeable battery or a solar battery.

The indicator 297 shows particular statuses of the electronic device 201 or a part (for example, AP 210) of the electronic device 201, for example, a booting status, a message status, a charging status and the like.

The motor 298 converts an electrical signal into mechanical vibrations, and generates a vibration or haptic effect.

The electronic device 201 may include a processing unit (e.g., a GPU) for supporting mobile TV. The processing unit for supporting mobile TV processes media data according to a standard of Digital Multimedia Broadcasting (DMB), Digital Video Broadcasting (DVB), media flow, etc.

Each of the components of the electronic device according to various embodiments of the present invention may be implemented by one or more components and the name of the corresponding component may vary depending on a type of the electronic device. In various embodiments of the present invention, the electronic device may include at least one of the above-described elements. Some of the above-described elements may be omitted from the electronic device, or the electronic device may further include additional elements. Further, some of the components of the electronic device may be combined to form a single entity, and thus, may equivalently execute functions of the corresponding elements prior to the combination.

Figure 3:
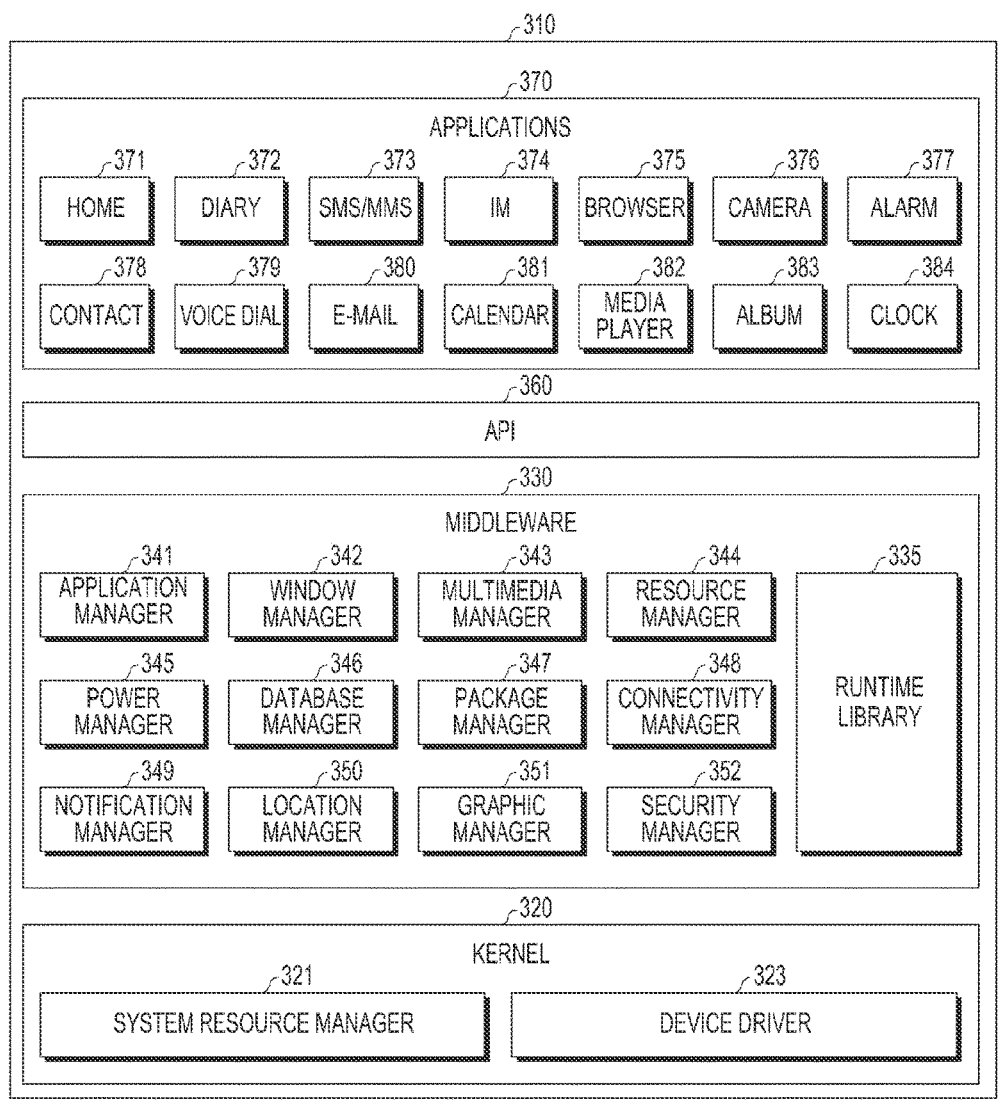
FIG. 3 is a block diagram of a programming module, according to an embodiment of the present invention.

FIG. 3 is a block diagram of a programming module, according to an embodiment of the present invention.

Referring to FIG. 3, a program module 310, according to various embodiments of the present invention, is provided. The program module 310 (for example, the program 140) may include an Operating System (OS) for controlling resources related to the electronic device 101 and/or various applications (for example, the application programs 147) executed in the operating system. The operating system may be, for example, Android, iOS, Windows, Symbian, Tizen, Bada, etc.

The programming module 310 includes a kernel 320, middleware 330, an Application Programming Interface (API) 360, and/or an applications 370. At least some of the program module 310 may be preloaded in the electronic device 101 or downloaded in the server 106.

The kernel 320 (or 141) may include, for example, a system resource manager 321 or a device driver 323.

The system resource manager 321 controls, allocates, or collects the system resources. The system resource manager 321 may include a process manager, a memory manager, or a file system manager. The device driver 323 may include a display driver, a camera driver, a Bluetooth driver, a shared-memory driver, a USB driver, a keypad driver, a Wi-Fi driver, an audio driver, or an Inter-Process Communication (IPC) driver.

The middleware 330 provides a function required by the applications 370 in common or provides various functions to the application 370 through the API 360 so that the applications 370 can efficiently use limited system resources of the electronic device 101. The middleware 330 (or 143) may include at least one of a run time library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, and a security manager 352.

The run time library 335 includes a library module that a compiler uses in order to add new functions through a programming language while at least one of the applications 370 is executed. The run time library 335 performs input/output management, memory management, or a function for an arithmetic function.

The application manager 341 manages a life cycle of at least one application among the applications 370.

The window manager 342 manages a GUI resource used in a screen of the electronic device 101.

The multimedia manager 343 detects a format required for reproducing various media files and encodes or decodes a media file using a codec appropriate for the corresponding format.

The resource manager 344 manages resources, such as a source code, a memory, or a storage space of at least one application among the applications 370.

The power manager 345 operates together with a Basic Input/Output System (BIOS) to manage a battery or power and provides power information required for the operation of the electronic device 101.

The database manager 346 generates, searches for, or changes a database to be used by at least one of the applications 370.

The package manager 347 manages the installation or the updating of applications 370 distributed in the form of package file.

The connectivity manager 348 manages wireless connections, such as WiFi or Bluetooth.

The notification manager 349 displays or notifies a user of an event, such as a received message, an appointment, and a proximity notification.

The location manager 350 manages location information of the electronic device 101.

The graphic manager 351 manages graphic effects to be provided to a user and user interfaces related to the graphic effects.

The security manager 352 provides various security functions required for system security or user authentication.

When the electronic device 101 has a call function, the middleware 330 may further include a telephony manager for managing a voice call function or a video call function of the electronic device 101.

The middleware 330 may include a middleware module for forming a combination of various functions of the aforementioned elements. The middleware 330 may provide modules specific to a type of operating systems in order to provide differentiated functions. In addition, a few of the component elements may be dynamically removed from the middleware 330, or new component elements may be added to the middleware 330.

The API 360 (or 145) is a set of API programming functions, and a different configuration thereof may be provided according to an operating system. For example, with respect to each platform, one API set may be provided for Android or iOS, and two or more API sets may be provided for Tizen.

The applications 370 (or 147) may include, for example, one or more applications which can provide functions such as home 371, diary 372, SMS/Multi-media Message Service (MMS) 373, Instant Message (IM) 374, browser 375, camera 376, alarm 377, contacts 378, voice dialer 379, email 380, calendar 381, media player 382, album 383, clock 384, health care (for example, to measure an exercise quantity or blood sugar), or environment information (for example, atmospheric pressure, humidity, or temperature information).

The applications 370 may include an application (hereinafter, referred to as an "information exchange application" for convenience of the description) supporting information exchange between the electronic device 101 and external electronic 102 and 104. The information exchange application may include a notification relay application for transmitting specific information to the external electronic device, or a device management application for managing the external electronic device.

The notification relay application includes a function of transferring, to the external electronic device 102 or 104, notification information generated from other applications of the electronic device 101 (for example, the SMS/MMS 371 application, the e-mail 380 application, a health management application, or an environmental information application). Further, the notification relay application receives notification information from, for example, the external electronic device and provides the received notification information to the user.

The device management application manages (for example, installs, deletes, or updates) at least one function of the external electronic device 102 and 104 communicating with the electronic device 101 (for example, a function of turning on/off the external electronic device itself (or some components) or a function of adjusting luminance (or a resolution) of the display), applications operating in the external electronic device, or services provided by the external electronic device (e.g., a call service and a message service).

The applications 370 may include an application (for example, a health management application) designated according to attributes (for example, attributes of the electronic device, such as the type of electronic device, which corresponds to a mobile medical device) of the external electronic device 102 or 104. The applications 370 may include an application received from the external electronic device (for example, the server 106, or the electronic devices 102 or 104). The applications 370 may include a preloaded application or a third party application which can be downloaded from the server. Names of the components of the program module 310, according to the above described embodiments of the present invention, may vary depending on the type of operating system.

According to various embodiments of the present invention, at least some of the programming module 310 may be implemented in software, firmware, hardware, or a combination thereof. At least some of the programming module 310 may be implemented (for example, executed) by the processor (for example, the AP 210). At least some of the programming module 310 may include a module, program, routine, sets of instructions, or a process for performing one or more functions.

The term "module" used in the present disclosure refers to, for example, a unit including one or more combinations of hardware, software, and firmware. The "module" may be interchangeable with a term, such as a unit, a logic, a logical block, a component, or a circuit. The "module" may be the smallest unit of an integrated component or a part thereof. The "module" may be a minimum unit for performing one or more functions or a part thereof. The "module" may be mechanically or electronically implemented. For example, the "module", may include at least one of an Application-Specific Integrated Circuit (ASIC) chip, a Field-Programmable Gate Arrays (FPGA), and a programmable-logic device for performing operations which are known or are to be developed hereinafter.

According to various embodiments, at least some of the devices (for example, modules or functions thereof) or the method (for example, operations) according to the present invention may be implemented by a command or instruction stored in a computer-readable storage medium in a programming module form. The instruction, when executed by a processor 120, may cause the one or more processors to execute the function corresponding to the instruction. The computer-readable storage medium may be, for example, the memory 130.

The computer readable recoding medium may include a hard disk, a floppy disk, magnetic media (e.g., a magnetic tape), optical media (e.g., a Compact Disc Read Only Memory (CD-ROM) and a Digital Versatile Disc (DVD)), magneto-optical media (e.g., a floptical disk), a hardware device (e.g., a Read Only Memory (ROM), a Random Access Memory (RAM), a flash memory), etc. In addition, the program instructions may include high-level language codes, which can be executed in a computer by using an interpreter, as well as machine codes made by a compiler. The aforementioned hardware device may be configured to operate as one or more software modules in order to perform the operation of the present invention, and vice versa.

The programming module according to the present invention may include one or more of the aforementioned components or may further include other additional components, or some of the aforementioned components may be omitted. Operations executed by a module, a programming module, or other component elements may be executed sequentially, in parallel, repeatedly, or in a heuristic manner. Further, some operations may be executed according to another order or may be omitted, or other operations may be added.

The various embodiments disclosed herein are provided merely to easily describe technical details of the present invention and to help the understanding of the present invention, and are not intended to limit the scope of the present invention. Therefore, it should be understood that all modifications and changes or modified and changed forms based on the technical idea of the present invention fall within the scope of the present invention.

Figure 4:
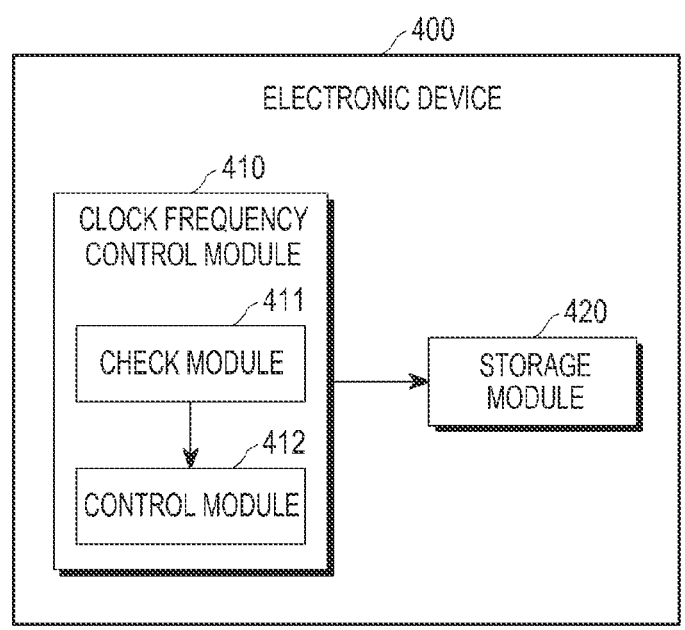
FIG. 4 is a block diagram of an electronic device for controlling a clock frequency, according to an embodiment of the present invention.

FIG. 4 is a block diagram of an electronic device for controlling a clock frequency, according to an embodiment of the present invention.

Referring to FIG. 4, an electronic device 400 for controlling a clock frequency, according to various embodiments of the present invention, is provided. The electronic device 400 (e.g., the electronic devices 101, 102 and 104 of FIG. 1) includes a clock frequency control module 410 and a storage module 420.

The clock frequency control module 410 includes a check module 411 and a control module 412, and controls a clock frequency of a high speed signal according to an RF band while an interface of the high speed signal is used.

The clock frequency control module 410 may include the processor 120 of FIG. 1.

The check module 411 may include a Communication Processor (CP).

The check module 411 checks a clock frequency of at least one RF band which is currently being used or is to be used in the electronic device 400, in real time, and transmits the checked RF band to the control module 412.

Specifically, the check module 411 checks a clock frequency of an RF band of an area where the electronic device 400 is to be moved and transmits the checked RF band, before a hand-off of the electronic device 400 occurs, to the control module 412. That is, when the electronic device 400 moves from a current area to another area, the check module 411 checks the clock frequency an RF band of the area where the electronic device is moved, through a high reception intensity of the other area, before the hand-off occurs.

The control module 412 may include the AP 220 of FIG. 2.

The control module 412 controls a clock frequency of a high speed signal which is currently being used, according to the RF band which is being used or is to be used in the electronic device 400.

While the interface of the high speed signal is used in the electronic device 400, when the clock frequency of the RF band received from the check module 411 is identical to a noise generation clock frequency, from among clock frequencies of the high speed signal, the control module 412 shifts the clock frequency of the high speed signal such that the clock frequency of the high speed signal is not identical to the clock frequency of the RF band.

For example, while data is output to a display module with a clock frequency of 499.5 MHz (i.e., data rate: 899 Mbps), in which noise is generated in a clock frequency of 468.2 MHz (i.e., data rate: 936.4 Mbps), when the clock frequency of the RF band received from the check module 411 is 468.2 MHz (i.e., data rate: 936.4 Mbps), (since 468.2 MHz, which is the noise generation clock frequency from among clock frequencies with which the data is output to the display module, is identical to 468.2 MHz, which is the clock frequency of the RF band), the control module 412 shifts 499.5 MHz, which is the clock frequency with which the data is output to the display module, to 445.5 MHz (i.e., data rate: 891.4 Mbps).

While the interface of the high speed signal is used in the electronic device 400, when the clock frequency of the RF band received from the check module 411 is not identical to the noise generation clock frequency, from among the clock frequencies of the high speed signal, the control module 412 maintains the clock frequency of the high speed signal.

For example, while the data is output to the display module with the clock frequency of 499.5 MHz (i.e., data rate: 899 Mbps), in which noise is generated in the clock frequency of 468.2 MHz (i.e., data rate: 936.4 Mbps), when the clock frequency of the RF band received from the check module 411 is 467.5 MHz (i.e., data rate: 935 Mbps), (since 468.2 MHz, which is the noise generation clock frequency from among clock frequencies with which the data is output to the display module, is not identical to 467.5 MHz, which is the clock frequency of the RF band), the control module 412 maintains 499.5 MHz, which is the clock frequency with which the data is output to the display module.

While the interface of the high speed signal is used in the electronic device 400, when the RF band is received from the check module 411, the control module 412 determines whether the received RF band is in a noise database (DB). When the received RF band is in the noise DB, if the control module 412 determines that the clock frequency of the received RF band is identical to the noise generation clock frequency of the high speed signal, the control module 142 shifts the clock frequency of the high speed signal.

For example, while the data is output to the display module with the clock frequency of 499.5 MHz (i.e., data rate: 899 Mbps), in which noise is generated in the clock frequency of 468.2 MHz (i.e., data rate: 936.4 Mbps), when the RF band is identical to any RF band among at least one band corresponding to the clock frequency of 499.5 MHz (i.e., data rate: 899 Mbps) in the noise DB, the control module 412 shifts the clock frequency of 499.5 MHz, with which the data is output to the display module, to the clock frequency of 445.5 MHz.

While the interface of the high speed signal is used in the electronic device 400, when the RF band is received from the check module 411, the control module 412 determines whether the received RF band is in the noise DB. When the received RF band is not in the noise DB, the control module 412 maintains the noise generation clock frequency of the high speed signal.

For example, while the data is output to the display module with the clock frequency of 499.5 MHz (i.e., data rate: 899 Mbps), in which noise is generated in the clock frequency of 468.2 MHz (i.e., data rate: 936.4 Mbps), when the RF band is not identical to any RF band from among at least one band corresponding to the clock frequency of 499.5 MHz (i.e., data rate: 899 Mbps) in the noise DB, the control module 412 maintains the clock frequency of 499.5 MHz with which the data is output to the display module.

While the interface of the high speed signal is used in the electronic device 400, when the control module 412 receives at least two RF bands from the check module 411 and at least one RF band among the at least two RF bands is identical to the noise generation clock frequency from among the clock frequencies of the high speed signal, the control module 412 shifts the clock frequency of the high speed signal such that the clock frequency of the high speed signal is not identical to the clock frequencies of the at least two RF bands.

For example, while the data is output to the display module with the clock frequency of 499.5 MHz (i.e., data rate: 899 Mbps), in which noise is generated in the clock frequency of 468.2 MHz (i.e., data rate: 936.4 Mbps), the control module 412 may receive at least two of an RF band for a WiFi communication, an RF band for a GPS communication, and an RF band for an Extended Global System for Mobile Communication (EGSM) from the check module 411, which are being used by the electronic device 400. When, for example, a clock frequency of the RF band for the ESGM, among the three RF bands is identical to the clock frequency of 468.2 MHz generating the noise, the control module 412 shifts the clock frequency of 499.5 MHz such that the clock frequency in which the data is output to the display module is not identical to a clock frequency of the RF band for the Wi-Fi communication and, the clock frequency of the RF band for the GPS communication, as well as the clock frequency of the RF band for the EGSM.

While the interface of the high speed signal is used in the electronic device 400, when the control module 412 receives at least two RF bands from the check module 411 and all RF bands from among at least two RF bands are not identical to the noise generation clock frequency from among the clock frequencies of the high speed signal, the control module 412 maintains the clock frequency of the high speed signal.

For example, while the data is output to the display module with the clock frequency of 499.5 MHz (i.e., data rate: 899 Mbps), in which noise is generated in the clock frequency of 468.2 MHz (i.e., data rate: 936.4 Mbps), the control module 412 may receive at least two of an RF band for Wi-Fi communication, an RF band for GPS communication, and the RF band for a EGSM from the check module 411, which are being used by the electronic device 400. When the clock frequencies of the at least two RF bands are not identical to the clock frequency of 468.2 MHz generating the noise, the control module 412 maintains the clock frequency of 499.5 MHz.

The storage module 420 may be, for example, the memory 130 shown in FIG. 1. The storage module 420 includes the noise DB storing various types of RF bands which may shift the clock frequency of a high speed signal used by the electronic device 400, in order to prevent a performance degradation of the RF band. That is, the noise DB stores the clock frequency of a high speed signal, and at least one RF band corresponding to the clock frequency of the high speed signal. At least one RF band has a clock frequency identical to the noise generation clock frequency from among the clock frequencies of the high speed signal.

FIGS. 5A and 5B illustrates types of RF bands having a clock frequency identical to a noise generation clock frequency of a high speed signal in an electronic device, according to an embodiment of the present invention.

Referring to FIGS. 5A and 5B, a clock frequency of a high speed signal, and at least one RF band corresponding to the clock frequency of the high speed signal is stored in a noise DB.

For example, when the clock frequency of the high speed signal is 500 MHz (i.e., data rate: 1 Gbps), as shown in FIG. 5A, the noise DB stores Channel (CH) 157 of GSM850, CH 117 of EGSM, CH 653 and CH 861 of Digital Cellular System (DCS), CH 653 of Personal Communication Service (PCS), etc., as the types of the RF bands having a clock frequency identical to the noise generation clock frequency in 500 MHz of the clock frequency of the high speed signal.

As another example, when the clock frequency of the high speed signal is 499.5 MHz (i.e., data rate: 999 Gbps), as shown in FIG. 5B, the noise DB stores CH 153 of GSM850, CH 112 of EGSM, CH 643 and CH 852 of DCS, CH 643 of PCS, etc., as the types of the RF bands having a clock frequency identical to the noise generation clock frequency in 499.5 MHz of the clock frequency of the high speed signal.

Figure 6:
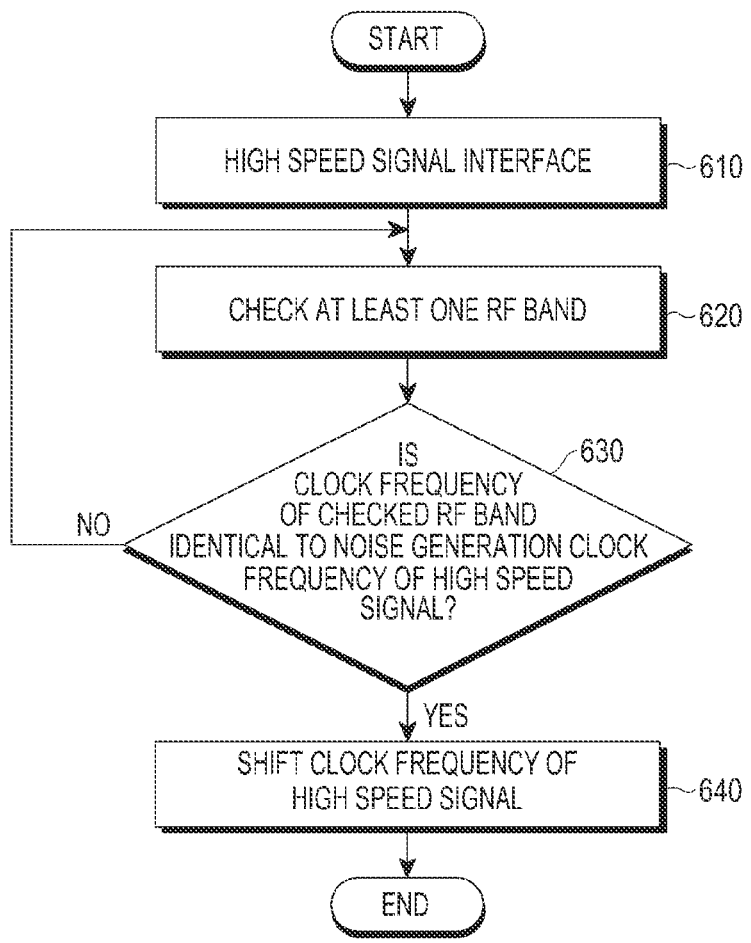
FIG. 6 is a flowchart illustrating a method of controlling a clock frequency in an electronic device, according to an embodiment of the present invention.

FIG. 6 is a flowchart illustrating a method of controlling a clock frequency in an electronic device, according to an embodiment of the present invention.

Referring to FIG. 6, in step 610, while the interface of the high speed signal is used by the electronic device 400, the check module 411, in step 620, checks the clock frequency of the RF band which is being used in the electronic device 400, in real time, or checks the clock frequency of the RF band of the area where the electronic device 400 is to be moved, before a hand-off of the electronic device 400 occurs, and transmits information on the checked RF band to the control module 412.

In step 630, the control module 412 determines whether the clock frequency of the checked RF band, received from the check module 411, is identical to the noise generation clock frequency from among the clock frequencies of the high speed signal which is currently being used.

When the control module 412 determines that the clock frequency of the checked RF band is not identical to the noise generation clock frequency from among the clock frequencies of the high speed signal which is currently being used, the control module 412 maintains the clock frequency of the high speed signal which is currently being used and returns to step 620.

When the control module 412 determines that the clock frequency of the checked RF band is identical to the noise generation clock frequency from among the clock frequencies of the high speed signal which is currently being used, the control module 412, in step 640, shifts the clock frequency of the high speed signal which is currently being used such that the clock frequency of the checked RF band is not identical to the clock frequency of the high speed signal.

Figure 7:
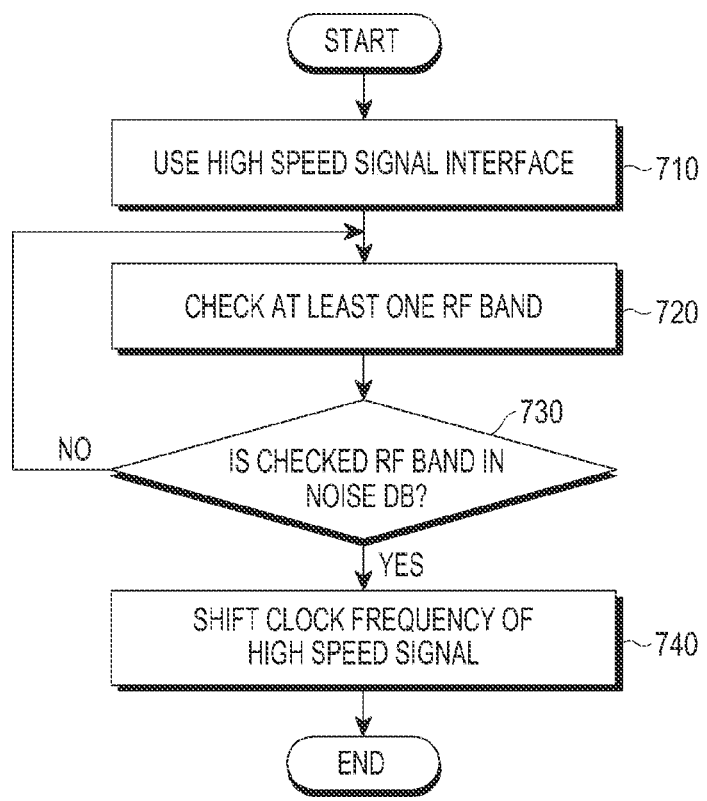
FIG. 7 is a flowchart illustrating a method of controlling a clock frequency using a noise database in an electronic device, according to an embodiment of the present invention.

FIG. 7 is a flowchart illustrating a method of controlling a clock frequency using a noise database in an electronic device, according to an embodiment of the present invention.

Referring to FIG. 7, in step 710, while the interface of the high speed signal is used by the electronic device 400, the check module 411, in step 720, checks the clock frequency of the RF band which is being used in the electronic device 400, in real time, or checks the clock frequency of the RF band of the area where the electronic device 400 is to be moved, before a hand-off of the electronic device occurs, and transmits information on the checked RF band to the control module 412.

In step 730, the control module 412 determines whether the type of the checked RF band, received from the check module 411, is in the noise database (DB) of the storage module 420.

When the control module 412 determines that the type of the checked RF band is not in the noise DB of the storage module 420, the control module 412 maintains the clock frequency of the high speed signal which is currently being used and returns to step 720.

When the control module 412 determines that the type of the checked RF band is in the noise DB of the storage module 420, the control module, in step 740, shifts the clock frequency of the high speed signal which is currently being used such that the clock frequency of the checked RF band is not identical to the clock frequency of the high speed signal.

Figure 8:
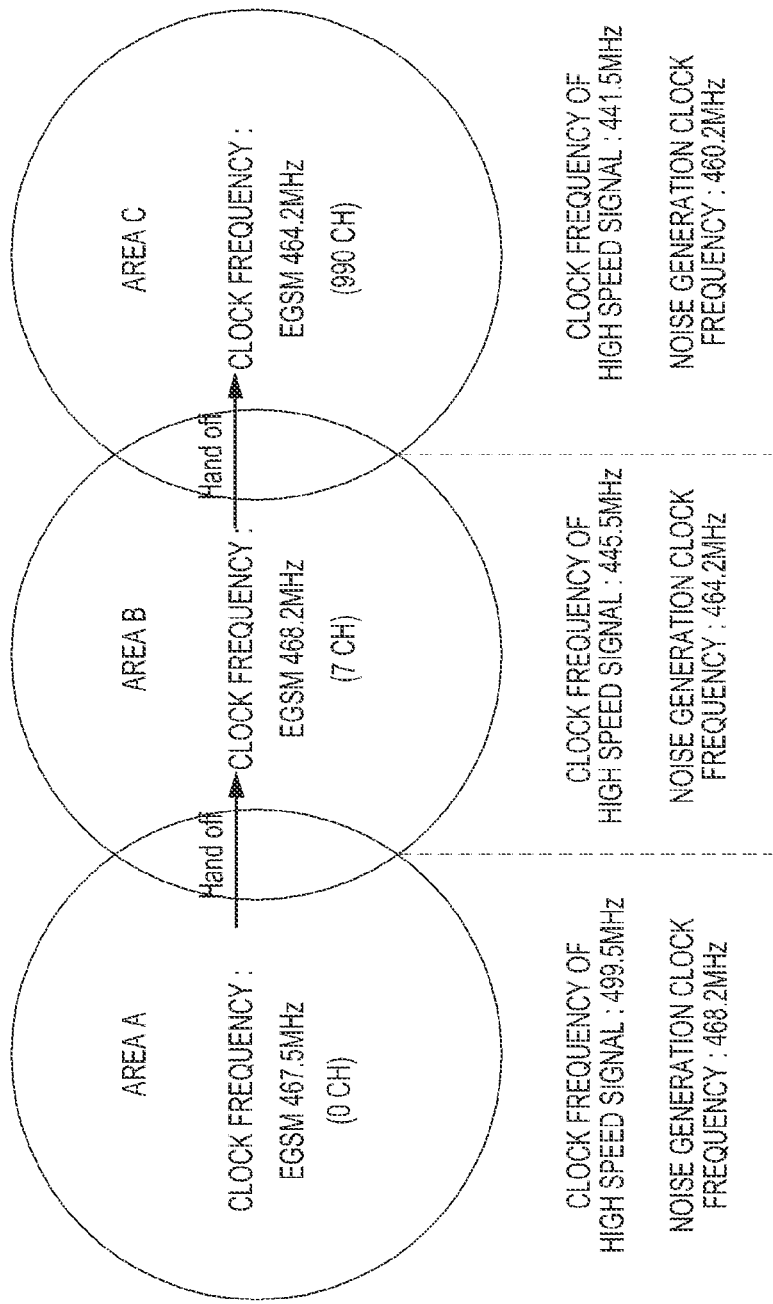
FIG. 8 illustrates an operation of controlling a clock frequency in an electronic device, according to an embodiment of the present invention.

FIG. 8 illustrates an operation of controlling a clock frequency in an electronic device, according to an embodiment of the present invention.

Referring to FIG. 8, while data is output to the display module in the electronic device 400 with the clock frequency of 499.5 MHz (i.e., data rate: 899 Mbps), in which noise is generated in the clock frequency of 468.2 MHz (i.e., data rate: 936.4 Mbps), when the electronic device 400 is positioned in area A (since a clock frequency of 467.5 MHz (i.e., data rate: 935 Mbps) of 0 Channel (CH) of EGSM which is an RF band of the area A is not identical to 468.2 MHz which is the noise generation clock frequency), the clock frequency of 499.5 MHz, with which the data is output to the display module, is maintained.

Before a hand-off of the electronic device 400 from area A to area B occurs, the electronic device 400 checks the clock frequency an RF band of area B, and since a clock frequency of 468.2 MHz (i.e., data rate: 936.4 Mbps) of 7 CH of EGSM, which is an RF band of area B, is identical to 468.2 MHz, which is the noise generation clock frequency, the clock frequency of 499.5 MHz, with which the data is output to the display module, is shifted to a clock frequency of 445.5 MHz (i.e., data rate: 891 Mbps). Since the clock frequency with which the data is output to the display module is shifted to the clock frequency of 445.5 MHz (i.e., data rate: 891 Mbps), the noise generation clock frequency is shifted to 464.2 MHz (928.4 Mbps). In addition, when the hand-off of the electronic device 400 to area B is performed, since the clock frequency of 468.2 MHz of 7 CH of EGSM, which is the RF band of the area B is not identical to 464.2 MHz of the noise generation clock frequency, a performance degradation for EGSM, which is the RF band of area B, can be prevented.

Before a hand-off of the electronic device 400 from area B to area C occurs, the electronic device 400 checks the clock frequency of an RF band of area C, and since a clock frequency of 464.2 MHz i.e., data rate: 928.4 Mbps) of 990 CH of EGSM, which is an RF band of area C, is identical to 464.2 MHz which is the noise generation clock frequency, the clock frequency of 445.5 MHz, with which the data is output to the display module, is shifted to the clock frequency of 441.5 MHz (i.e., data rate: 883 Mbps). Since the clock frequency with which the data is output to the display module is shifted to the clock frequency of 441.5 MHz (i.e., data rate: 883 Mbps), the noise generation clock frequency is shifted to 460.2 MHz (920.4 Mbps). In addition, when the hand-off of electronic device 400 to area C is performed, since the clock frequency of 464.2 MHz of 990 CH of EGSM, which is the RF band of area C, is not identical to 460.2 MHz of the noise generation clock frequency, a performance degradation for EGSM, which is the RF band of area C, can be prevented.

While the present invention has been shown and described with reference to certain embodiments, it should be understood by those skilled in the art that various changes in form and details may be made therein without departing from the spirit and scope of the present invention. Therefore, the scope of the present invention is defined not by the detailed description of the present invention, but by the appended claims and their equivalents, and thus, all differences within the scope will be construed as being included in the present invention.

What is claimed is:

1. An electronic device comprising:
   a memory; and
   at least one processor configured to:
      identify a predetermined event for hand off of the electronic device;
      in response to identifying the predetermined event, check a clock frequency of at least one Radio Frequency (RF) band which is to be used after the hand off of the electronic device;
      check a clock frequency of a high speed signal currently in use and a noise generation clock frequency corresponding to the clock frequency of the high speed signal currently in use; and
      shift the clock frequency of the high speed signal such that the noise generation clock frequency and the clock frequency of the at least one RF band checked by the at least one processor are not identical, when an interface of the high speed signal is used,
      wherein the noise generation clock frequency is a frequency at which noise occurs due to the clock frequency of the high speed signal currently in use.

2. The electronic device of claim 1, wherein the at least one processor is further configured to:
   when the at least one RF band is received from the at least one processor, determine whether the received at least one RF band is in a noise database, and
   shift the clock frequency of the high speed signal, when the received at least one RF band is in the noise database.

3. The electronic device of claim 1, wherein the memory includes a noise database which stores the clock frequency of the high speed signal, and at least one RF band corresponding to the clock frequency of the high speed signal, and
   wherein at least one RF band stored in the noise DB has a clock frequency identical to the noise generation clock frequency.

4. The electronic device of claim 1, wherein the processor is further configured to:
   when at least two RF bands are received from the at least one processor and a clock frequency of at least one RF band among the at least two RF bands is identical to the noise generation clock frequency, shift the clock frequency of the high speed signal such that the clock frequency of the high speed signal is not identical to clock frequencies of the at least two RF bands.

5. A method of controlling a clock frequency of an electronic device, the method comprising:
   identifying a predetermined event for hand off of the electronic device;
   in response to identifying the predetermined event, checking a clock frequency of at least one Radio Frequency (RF) band which is to be used after the hand off;
   checking a clock frequency of a high speed signal currently in use and a noise generation clock frequency corresponding to the clock frequency of high speed signal currently in use; and
   shifting the clock frequency of the high speed signal such that the noise generation clock frequency among clock frequencies of the high speed signal and the clock frequency of the at least one RF band checked are not identical, when an interface of the high speed signal is used,
   wherein the noise generation clock frequency is a frequency at which noise occurs due to the clock frequency of the high speed signal currently in use.

6. The method of claim 5, wherein shifting the clock frequency of the high speed signal comprises:
   when the at least one RF band is received, determining whether the received at least one RF band is in a noise database; and
   shifting the clock frequency of the high speed signal, when the received at least one RF band is in the noise database.

7. The method of claim 5, wherein the clock frequency of the high speed signal, and a type of the RF band corresponding to the clock frequency of the high speed signal are stored in a noise database, and at least one RF band stored in the noise database has a clock frequency identical to the noise generation clock frequency.

8. The method of claim 5, wherein shifting the clock frequency of the high speed signal comprises:
   when at least two RF bands are received, determining whether a clock frequency of at least one RF band among the at least two RF bands is identical to the noise generation clock frequency; and
   shifting the clock frequency of the high speed signal such that the clock frequency of the high speed signal is not identical to the clock frequencies of the at least two RF bands, when the clock frequency of the at least one RF band among the at least two RF bands is identical to the noise generation clock frequency.

\* \* \* \* \*